(12) United States Patent
Kamiya

(10) Patent No.: US 7,851,520 B2
(45) Date of Patent: Dec. 14, 2010

(54) THERMOSETTING EPOXY RESIN COMPOSITION

(75) Inventor: Kazunobu Kamiya, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 464 days.

(21) Appl. No.: 11/884,148

(22) PCT Filed: Jul. 10, 2006

(86) PCT No.: PCT/JP2006/313704

§ 371 (c)(1),
(2), (4) Date: Aug. 10, 2007

(87) PCT Pub. No.: WO2007/007725

PCT Pub. Date: Jan. 18, 2007

(65) Prior Publication Data

US 2009/0275708 A1 Nov. 5, 2009

(30) Foreign Application Priority Data

Jul. 11, 2005 (JP) .............................. 2005-201161

(51) Int. Cl.
*C08L 63/00* (2006.01)
(52) U.S. Cl. ...................................... 523/457; 523/466
(58) Field of Classification Search .................. None
See application file for complete search history.

(56) References Cited

U.S. PATENT DOCUMENTS

| 6,794,038 | B2 * | 9/2004 | Matsushima | ................ | 428/407 |
| 6,831,117 | B2 * | 12/2004 | Matsushima | ................ | 523/213 |
| 6,921,782 | B2 * | 7/2005 | Matsushima | ................ | 523/457 |
| 2004/0109943 | A1 * | 6/2004 | Matsushima et al. | ........ | 427/212 |
| 2004/0109949 | A1 | 6/2004 | Matsushima | | |
| 2004/0110004 | A1 | 6/2004 | Matsushima | | |

FOREIGN PATENT DOCUMENTS

| CN | 1125488 C | 10/2003 |
| JP | A 2002-212537 | 7/2002 |
| JP | A 2002-363255 | 12/2002 |
| JP | A 2002-368047 | 12/2002 |
| JP | A 2003-13036 | 1/2003 |
| JP | A 2006-70051 | 3/2006 |

OTHER PUBLICATIONS

Journal of The Chemical Society of Japan, No. 1, pp. 1-14 (1993).
Journal of The Chemical Society of Japan, No. 7, pp. 625-631 (1994).
Feb. 26, 2010 Office Action issued in Chinese Patent Application No. 2006-80025052.8 (with translation).

* cited by examiner

*Primary Examiner*—Michael J Feely
(74) *Attorney, Agent, or Firm*—Oliff & Berridge, PLC

(57) ABSTRACT

The thermosetting epoxy resin composition of the present invention includes an aluminum chelate/silanol curing catalyst system, an epoxy resin, and an anion-trapping agent. The anion-trapping agent is preferably an aromatic phenol derivative or an acid anhydride. Examples include bisphenol S, bisphenol A, bisphenol F, and 4,4'-dihydroxyphenol ether, and acetic anhydride, propionic anhydride, maleic anhydride and phthalic anhydride. The aluminum chelate/silanol curing catalyst system is composed of an aluminum chelator and a silane-coupling agent. The aluminum chelator is preferably a latent aluminum chelate curing agent carried by a porous resin obtained through interfacial polymerization of a polyfunctional isocyanate compound. Even when a terminal epoxy resin is contained as the epoxy component of a thermosetting epoxy resin composition containing an aluminum chelate/silanol curing catalyst system, the epoxy resin composition can be configured to cure rapidly at low temperatures without termination of polymerization.

10 Claims, 9 Drawing Sheets

×3000

×25000

THERMOSETTING EPOXY RESIN COMPOSITION

TECHNICAL FIELD

The present invention relates to a thermosetting epoxy resin composition containing an aluminum chelate/silanol curing catalyst system.

BACKGROUND ART

Thermosetting epoxy resin compositions are widely used as adhesives and as materials to make molded articles. The aluminum chelate/silanol curing catalyst system is a type of catalyst system used to cure thermosetting epoxy resin compositions (Non-Patent Documents 1 and 2). Although generally known as a cationic epoxy-curing catalyst, this catalyst system in fact consists of a cationic active species and an anionic active species as depicted in the following formula.

[Chemical formula 1]

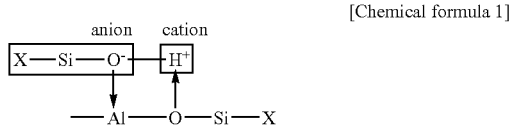

[Non-Patent Document 1] Journal of the Chemical Society of Japan, 1993 (1), 1-14

[Non-Patent Document 2] Journal of the Chemical Society of Japan, 1994 (7), 625-631

DISCLOSURE OF THE INVENTION

Problems to be Solved by the Invention

In general, the ring-opening polymerization of the oxirane rings present in epoxy resins proceeds by the following mechanism: The cationic species (i.e., electrophile) of the catalyst system attacks the oxygen atom of the oxirane ring while the anionic species (i.e., nucleophile) attacks the beta-carbon from behind the oxirane ring, causing the ring to open up. When the aluminum chelate/silanol curing catalyst system is used to polymerize epoxy resins having terminal epoxy groups (referred to as "terminal epoxy resins," hereinafter), the silanolate anion serving as the anionic species nucleophilically attacks the beta-carbon of the oxirane ring of the terminal epoxy group and binds to it. As a result, the polymerization is terminated. To circumvent this problem, epoxy compounds or epoxy resins having internal epoxy groups (referred to as "internal epoxy compounds" or "internal epoxy resins," hereinafter), whose structure impedes the nucleophilic addition of the silanolate anion to the beta-carbon from behind the oxirane ring, must be used as thermosetting epoxy components when the aluminum chelate/silanol curing catalyst system is employed in making thermosetting epoxy resin compositions that can rapidly cure at low temperatures. Accordingly, the use of the terminal epoxy resins has been significantly limited.

There is a significant need to improve the curing performance of thermosetting epoxy resin compositions using the aluminum chelate/silanol curing catalyst system. Several different approaches have been taken to meet this need. Among such approaches are (a) to use a highly active aluminum chelator in the curing catalyst system, (b) to increase the amount of curing catalyst, and (c) to provide the latent curing catalyst in the form of microcapsules to reduce the latency of the catalyst.

One disadvantage of the approach (a) is that the highly active aluminum chelator readily reacts with ambient moisture, making the thermosetting epoxy resin composition extremely difficult to handle or store. Furthermore, the highly active aluminum chelator limits the structure of the silane-coupling agent that can be used with the chelator. This makes it difficult to design the performance of thermosetting epoxy resin compositions as desired (for example, by making use of the functional groups of the coupling agent to form chemical bonds).

The approach (b) results in a decrease in the pot life of the thermosetting epoxy resin composition. The approach also requires the use of increased amounts of the silane-coupling agent. As a result, the curing catalyst system is diluted and the performance of the cured product of the thermosetting epoxy resin composition is reduced.

The approach (c) causes a reduction in the stability of the thermosetting epoxy resin composition provided as a single formulation. Also, the solvent-resistance of the microcapsules is decreased.

The present invention addresses the above-described problems of the prior art. Specifically, it is an object of the present invention to provide a way to utilize a terminal epoxy resin as the epoxy component of a low-temperature, fast-curing thermosetting epoxy resin composition containing aluminum chelate/silanol curing catalyst system. It is another object of the present invention to improve the curing performance of a thermosetting epoxy resin composition (such as enhancement of curability, reduction in curing time, or the exothermic peak shifting to a lower temperature in DSC measurement) without causing the problems associated with the above-described approaches (a), (b) and (c).

Means for Solving the Problems

The present inventor added an anion-trapping agent to the aluminum chelate/silanol curing catalyst system used in thermosetting epoxy resin compositions, and discovered that such an anion-trapping agent serves both to ensure that the cationic species attacks the oxygen atom in the oxirane ring and to prevent nucleophilic addition of the silanolate anion to the beta-carbon of the oxirane ring of terminal epoxy resins. Thus, the presence of the anion-trapping agent enables the use of terminal epoxy resins in low-temperature, fast-curing thermosetting epoxy resin compositions containing aluminum chelate/silanol curing catalyst system. It is this discovery that ultimately led to the present invention. The present inventor also discovered that an acid anhydride can be used as the anion-trapping agent to further improve the curing performance of thermosetting epoxy resin compositions. This discovery serves as a preferred embodiment of the present invention.

Specifically, the present invention provides a thermosetting epoxy resin composition containing an aluminum chelate/silanol curing catalyst system, an epoxy resin, and an anion-trapping agent. Preferably, the anion-trapping agent is an aromatic phenol. When it is desired to improve the curing performance of the thermosetting epoxy resin composition, an acid anhydride is preferably used as the anion-trapping agent.

ADVANTAGE OF THE INVENTION

According to the present invention, the anion-trapping agent used in conjunction with the aluminum chelate/silanol curing catalyst system serves to prevent nucleophilic addition of the silanolate anion to the beta-carbon of the oxirane ring of a terminal epoxy resin without impeding attacks on the oxygen atom of the oxirane ring by the cationic species. Thus, the present invention enables the use of a terminal epoxy resin as the epoxy component of a low-temperature, fast-curing thermosetting epoxy resin composition containing aluminum chelate/silanol curing catalyst system.

The curing performance of thermosetting epoxy resin compositions can be improved especially when the anion-trapping agent is an acid anhydride. Specifically, the curing activity of the aluminum chelate/silanol catalyst is increased and the curing time is decreased. The curing temperature can be lowered when the aluminum chelator has latency. Such an aluminum chelator may be used not only with alicyclic epoxy resins such as cyclohexane oxide, but also with universal epoxy resin compositions, to promote curing of the resin compositions. The addition of the acid anhydride does not significantly affect the design of the thermosetting resin composition, since in any combinations, the amount of acid anhydride required to activate the aluminum chelate/silanol catalyst is at most the same catalytic amount as the aluminum chelator. The use of the latent aluminum chelate curing agent ensures high storage stability of the curing system, whether the resin composition is provided as a single formulation or not, since an acid anhydride by nature has a long pot life. Furthermore, an acid anhydride, which has originally been used as a curing agent for epoxy resins, is incorporated in the polymerization of the thermosetting epoxy resin composition and therefore does not affect the curing performance of the resin composition.

REFERENCE NUMERALS

Figure 1A:
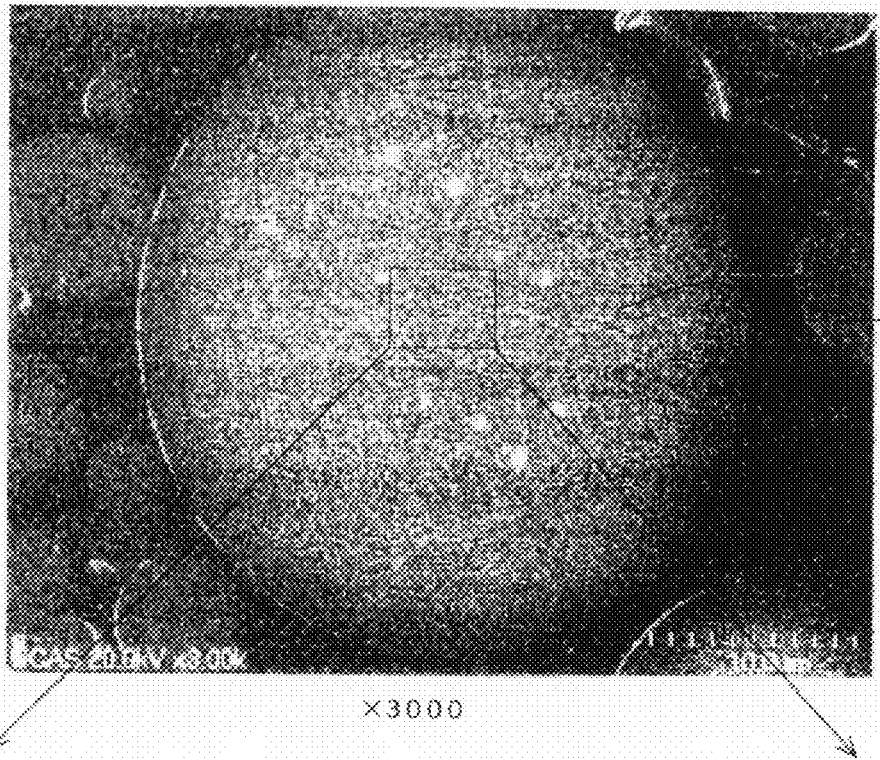
FIG. 1A is an electron micrograph of particles of a latent curing agent.

1. Latent aluminum chelate curing agent
2. Porous resin matrix
3. Pores

BEST MODE FOR CARRYING OUT THE INVENTION

The thermosetting epoxy resin composition of the present invention comprises an aluminum chelate/silanol curing catalyst system, an epoxy resin and an anion-trapping agent. While the anion-trapping agent acts to capture silanolate anions produced by the aluminum chelate/silanol curing catalyst system and prevent nucleophilic addition of the silanolate anions to the beta-carbon of the oxirane rings of terminal epoxy resins, it does not impede attacks on the oxygen atom of the oxirane rings by the cationic species, and therefore ring-opening polymerization can be carried out. In other words, the anion-trapping agent can also promote ring-opening polymerization of terminal epoxy resins.

Examples of the anion-trapping agents used in the present invention include any anion-trapping agents which prevent nucleophilic addition of the silanolate anions produced by the aluminum chelate/silanol curing catalyst system to the beta-carbon of the oxirane rings of terminal epoxy resins while they act to capture silanolate anions in order not to inhibit the open-ring polymerization. Example of such anion-trapping agents include aromatic phenol derivatives having aromatic hydroxyl group, aromatic carboxylic acid derivatives having aromatic carboxyl group, and aromatic ketone derivatives having aromatic carbonyl group. Of these, aromatic phenol derivatives are particularly preferred because of their high curability and storage stability. Specific examples of aromatic phenol derivatives include bisphenol S, bisphenol A, bisphenol F and 4,4'-dihydroxyphenyl ether, as shown below.

[Chemical formula 2]

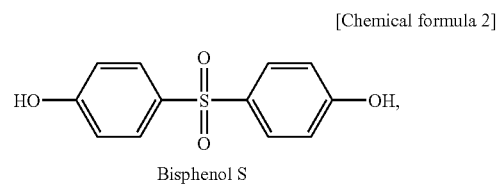

Bisphenol S

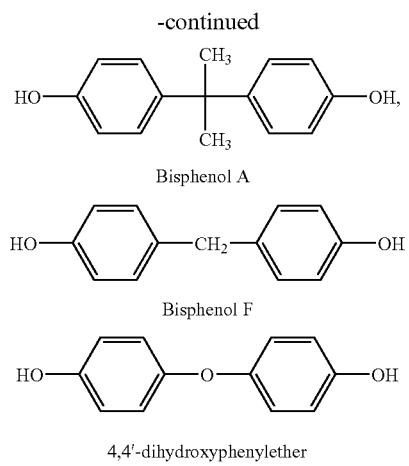

Bisphenol A

Bisphenol F 4,4'-dihydroxyphenylether

The amount of the anion-trapping agent present in the thermosetting epoxy resin composition of the present invention is preferably in the range of 0.5 to 20 wt % and more preferably in the range of 5 to 15 wt % (by solid content). Too little of the anion-trapping agent results in a decrease in the curability, whereas too much of it leads to a decreased storage stability. As used herein, the phrase "by solid content" means that measurements were taken with reference to the solid component of cured thermal epoxy resin composition.

The anion-trapping agent for use in the thermosetting epoxy resin composition of the present invention is preferably an acid anhydride when it is desired to improve the curing performance of the thermosetting epoxy resin composition (such as enhancement of curability, reduction in curing time, or the exothermic peak shifting to a lower temperature in DSC measurement).

When used as the anion-trapping agent, the acid anhydride preferentially captures silanolate anions, the chemical species that is produced by the aluminum chelate/silanol curing catalyst and acts to terminate polymerization. This facilitates the dissociation of Bronsted acid and promotes cationic polymerization. In other words, the rate of curing is increased.

As shown by the following mechanism, the acid anhydride may also capture the Bronsted acid (H$^+$) to form a carboxylic acid or it may form an anionic species during ring-opening reaction. This may inhibit the cationic polymerization. Thus, the amount of the acid anhydride to serve as the anion-trapping agent in the thermosetting epoxy resin composition of the present invention is preferably less than or equal to the amount of the curing catalyst.

[Chemical formula 3]

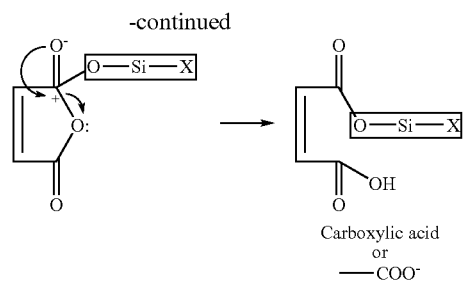

Carboxylic acid
or
—COO$^-$

Examples of the acid anhydride include aliphatic carboxylic anhydrides, such as acetic anhydride, propionic anhydride, butyric anhydride, hexanoic anhydride and acetic propionic anhydride, aliphatic dicarboxylic anhydrides, such as succinic anhydride and maleic anhydride, alicyclic carboxylic anhydrides, such as cyclohexanoic carboxylic acid, aromatic carboxylic anhydrides, such as benzoic anhydride, and aromatic dicarboxylic anhydride, such as phthalic anhydride. Of these acid anhydrides, acetic anhydride, propionic anhydride, maleic anhydride and phthalic anhydride are particularly preferred.

The aluminum chelate/silanol curing catalyst system for use in the present invention is composed of an aluminum chelator and a silane-coupling agent. The catalyst system may be formed by adding the aluminum chelator and the silane-coupling agent to the polymerization system, or the two components may be mixed in advance to form a mixture.

While any known aluminum chelator may be used in the present invention, latent aluminum chelate curing agents are particularly preferred. These latent curing agents consist of an aluminum chelator carried by a porous resin obtained through interfacial polymerization of a polyfunctional isocyanate compound. Such latent curing agents may be directly added to a thermosetting epoxy resin composition to make an epoxy resin composition as a single formulation that has significantly higher storage stability.

Figure 1B:
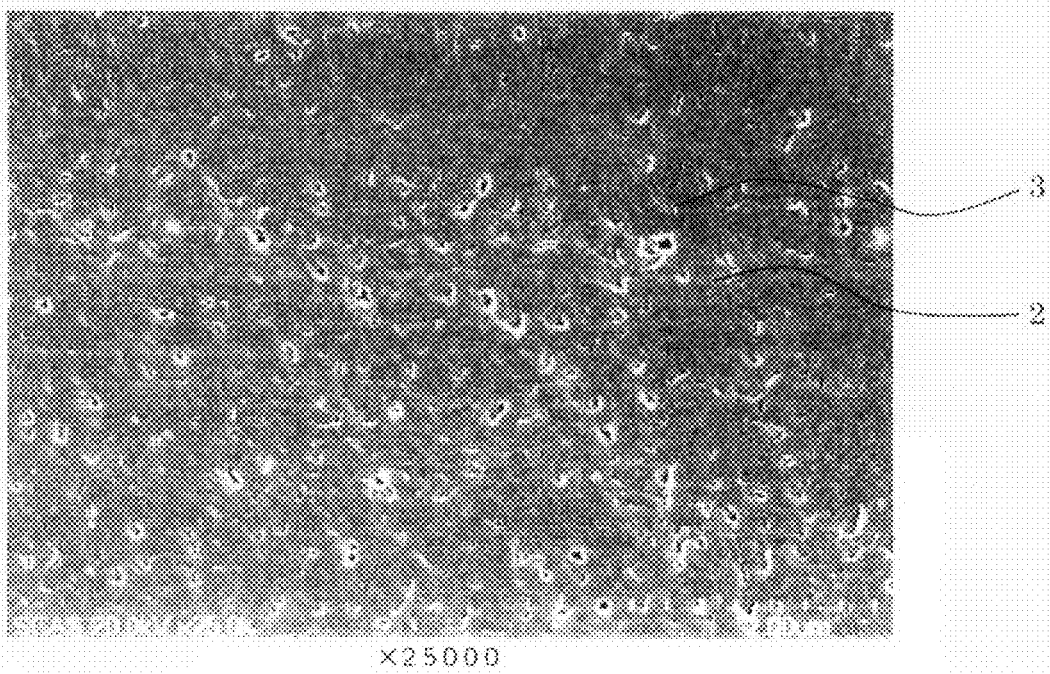
FIG. 1B is an enlarged central portion of the electron micrograph of the particles of the latent curing agent shown in FIG. 1A.

Unlike the simple microcapsule structure that consist of an aluminum chelator core coated with a porous resin shell, the latent aluminum chelate curing agent 1, as shown in an electron micrograph (FIG. 1A) and an enlarged view of its central portion (FIG. 1B), is made up of an aluminum chelator retained within numerous pores 3 formed in porous resin matrix 2.

Produced by using interfacial polymerization technique, the latent aluminum chelate curing agent 1 for use in the present invention is a sphere that is preferably sized from 0.5 to 100 μm. The curing agent in this size range has high curability and dispersibility. The pores 3 are preferably 5 to 150 nm in size to ensure high curability and latency.

It is preferred that the porous resin used has a desired degree of crosslinking depending on the desired application since too small a degree results in a decrease in the latency of the latent aluminum chelate curing agent 1 while too large a degree causes a reduction in the thermal response of the curing agent. The degree of crosslinking of a given porous resin can be determined by micro-compression test.

Preferably, the latent aluminum chelate curing agent 1 for use in the present invention does not substantially contain an organic solvent upon interfacial polymerization to ensure curing stability. Specifically, it is preferred that the curing agent contains an organic solvent at a concentration of 1 ppm or less.

The respective amounts of the porous resin and the aluminum chelator present in the latent aluminum chelate curing agent 1 need to be properly balanced since too little of the aluminum chelator leads to a decrease in the thermal response while too much of it decreases the latency. The aluminum chelator is preferably present in an amount of 10 to 200 parts by weight and, more preferably, in an amount of 10 to 150 parts by weight with respect to 100 parts by weight of the porous resin.

The aluminum chelator for the latent aluminum chelate curing agent may be a complex compound as shown by the formula (1) below in which three molecules of beta-ketoenolate anion are coordinated with an aluminum atom.

[Chemical formula 4]

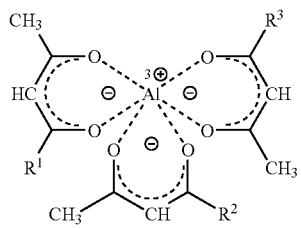

(1)

In the formula (1) above, $R^1$, $R^2$ and $R^3$ are each independently an alkyl or alkoxyl group. Examples of the alkyl group include methyl group and ethyl group. Examples of the alkoxyl group include methoxy group, ethoxy group and oleyloxy group.

Specific examples of the aluminum chelator shown by the formula (1) include aluminum tris(acetylacetonate), aluminum tris(ethyl acetoacetate), aluminum monoacetylacetonate bis(ethyl acetoacetate), aluminum monoacetylacetonate bisoleyl acetoacetate, ethyl acetoacetate aluminum diisopropylate and alkyl acetoacetate aluminum diisopropylate.

The polyfunctional isocyanate compound for use in the present invention preferably has two or more, more preferably three isocyanate groups in its molecule. Among preferred examples of such trifunctional isocyanate compounds are TMP adducts shown by the formula (2) below obtained by reacting 3 moles of a diisocyanate compound with 1 mole of trimethylolpropane, isocyanulates shown by the formula (3) below obtained by self-condensation of 3 moles of a diisocyanate compound, and beurets shown by the formula (4) below obtained by condensation of diisocyanate urea, formed of 2 out of 3 moles of diisocyanate compounds, with the remaining 1 mole of diisocyanate.

[Chemical formula 5]

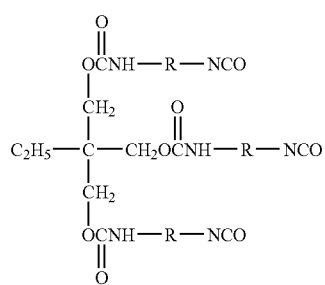

(2)

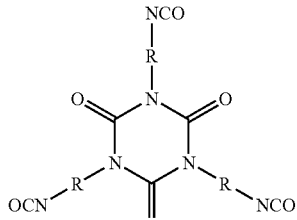

(3)

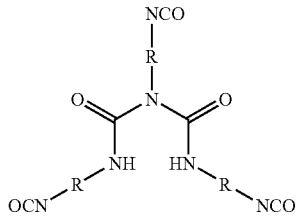

(4)

In the formulas (2) through (4) above, the substituent R is a diisocyanate compound with its isocyanate group removed. Examples of such diisocyanate compounds include toluene 2,4-diisocyanate, toluene 2,6-diisocyanate, m-xylylene diisocyanate, hexamethylene diisocyanate, hexahydro-m-xylylene diisocyanate, isophorone diisocyanate, and methylenediphenyl-4,4'-diisocyanate.

The porous resin for use in the present invention is obtained by interfacial polymerization of the polyfunctional isocyanate compounds. During the polymerization, part of an isocyanate group is hydrolyzed to form an amino group, which in turn reacts with another isocyanate group, forming a urine bond. This process continues to eventually form a polymer as porous polyurea. When the latent curing agent of the present invention, which consists of the porous resin and the aluminum chelator retained within the pores of the resin, is heated for curing, the retained aluminum chelator comes into contact with the silane-coupling agent and the thermosetting resin that exist with the latent curing agent. This promotes the curing though the exact mechanism still remains unclear.

Because of the structure of the latent aluminum chelate curing agent, it is considered that the aluminum chelator is inevitably present on the surface of the curing agent. However, during interfacial polymerization, the water present in the system inactivates the aluminum chelator present on the surface of the curing agent, leaving the aluminum chelator active only within the porous resin, whereby the resulting curing agent is considered to achieve the latency.

The latent aluminum chelate curing agent can be produced in the following manner: The aluminum chelator and the polyfunctional isocyanate compound are dissolved in a volatile organic solvent. This solution is added to an aqueous phase containing a disperser and the mixture is heated and stirred to promote interfacial polymerization.

The first step in the above-described process is dissolving the aluminum chelator and the polyfunctional isocyanate compound in a volatile organic solvent to form a solution that serves as the oil phase in the interfacial polymerization. The volatile organic solvent is used for the following reason: Solvents used in normal interfacial polymerization have a high boiling point of above 300° C. Since such solvents do not evaporate during the process, the chance that the isocyanate comes into contact with water remains so small that the interfacial polymerization does not proceed to a sufficient degree. Thus, the polymer with desired shape-retaining property can hardly be obtained by such interfacial polymerization, or even if such a polymer can be obtained, the high boiling point solvent will remain trapped within the polymer and, when the polymer is used in the thermosetting resin composition, adversely affect the physical property of the cured product of the resin composition. It is thus necessary to use volatile organic solvents in the preparation of the oil phase.

Volatile organic solvent suitable for this purpose are those that are good solvents of the aluminum chelator and the polyfunctional isocyanate compound (i.e., the solvents can dissolve 0.1 g/ml or more of each), do not substantially dissolve in water (i.e., the solubility of water in the solvent is 0.5 g/ml or less), and have a boiling point of 100° C. or below under atmospheric pressure. Specific examples of the volatile organic solvents are alcohols, acetic acid esters and ketones. Ethyl acetate is particularly preferred because of its high polarity, low boiling point and poor solubility in water.

The amount of the volatile organic solvent used is preferably in the range of 100 to 500 parts by weight with respect to 100 parts by weight of the aluminum chelator and the polyfunctional isocyanate compound combined. Too little solvent results in a decrease in the latency while too much of it causes a decreased heat response.

The viscosity of the solution to serve as the oil phase can be decreased by using a relatively large amount of the volatile organic solvent within the specified range. The low viscosity increases the efficiency of stirring and thus makes it possible to form fine and uniform droplets of the oil phase in the reaction system. As a result, the size of the latent curing agent particles can be controlled within the range of submicron to several microns and the size distribution can be made monodisperse. The solution to serve as the oil phase preferably has a viscosity of 1 to 2.5 mPa·S.

Figure 10A:
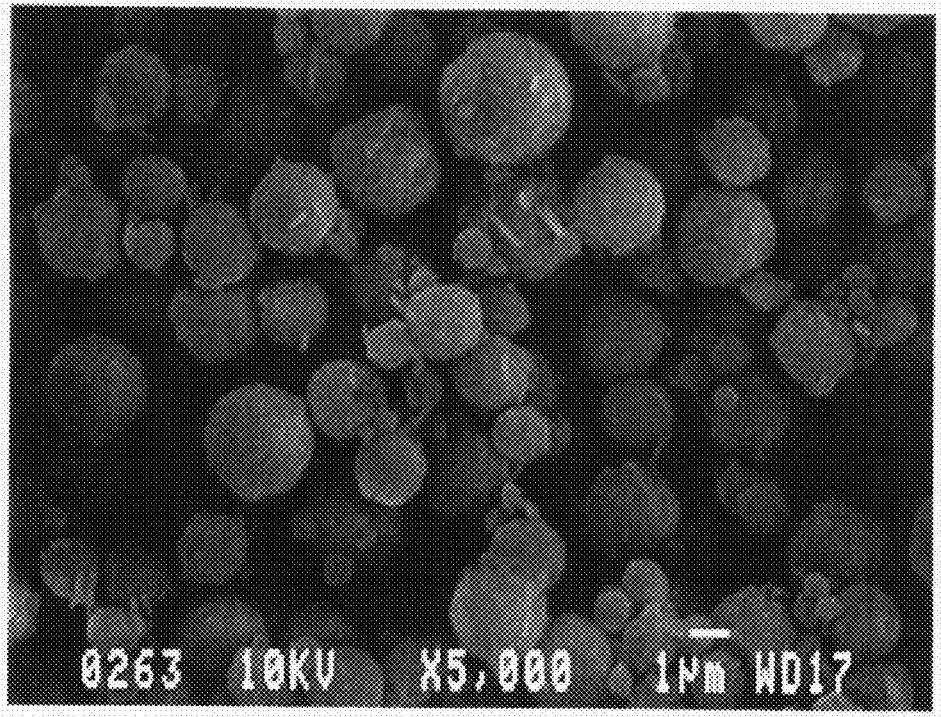
FIG. 10A is an electron micrograph of particles of a conventional latent curing agent with partially saponified PVA.
Figure 10B:
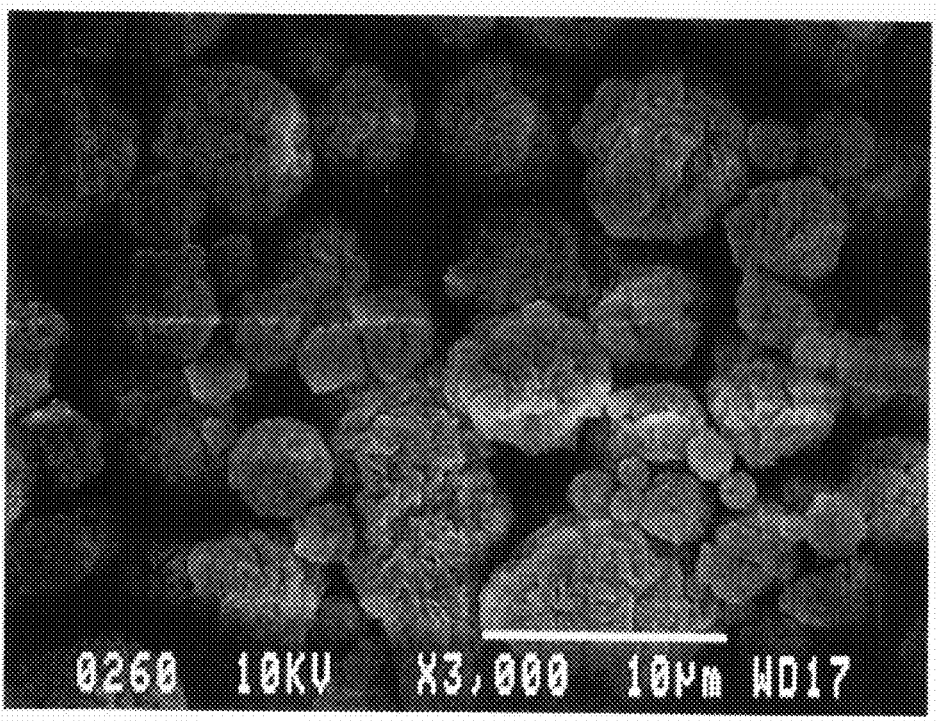
FIG. 10B is an electron micrograph of particles of a conventional latent curing agent with fully saponified PVA.

When PVA is used to emulsify and disperse the polyfunctional isocyanate compound, the hydroxyl groups of PVA react with the polyfunctional isocyanate compound. As a result, a by-product may be formed that adheres to the particles of the latent curing agent (FIG. 10A: partially saponified PVA), or the particles may be deformed (FIG. 10B: fully saponified PVA). Two approaches are used to prevent these phenomena from occurring: increasing the reactivity of the polyfunctional isocyanate compound with water, or decreasing the reactivity of the polyfunctional isocyanate compound with PVA.

To increase the reactivity of the polyfunctional isocyanate compound with water, the aluminum chelator is preferably used in an amount that is half as much or less than, more preferably one-third as much or less than the weight of the polyfunctional isocyanate compound. This increases the chance that the polyfunctional isocyanate compound comes into contact with water, so that the polyfunctional isocyanate compound can react with water before PVA comes into contact with the surface of the droplets of the oil phase.

To decrease the reactivity of the polyfunctional isocyanate compound with PVA, the amount of the aluminum chelator in the oil phase can be increased. Specifically, the aluminum chelator is used in an amount that is preferably equal to or more than, more preferably 1.0 to 2.0 times as much as, the weight of the polyfunctional isocyanate compound. In this manner, the concentration of isocyanate at the surface of the droplets of the oil phase is decreased. In addition, the polyfunctional isocyanate compound reacts with the amine formed by hydrolysis at a greater reaction rate (interfacial polymerization) than with the hydroxyl groups. As a result, the probability of the polyfunctional isocyanate compound reacting with PVA can be decreased.

To dissolve the aluminum chelator and the polyfunctional isocyanate compound in the volatile organic solvent, the components can be mixed and stirred under atmospheric pressure and at room temperature. When necessary, the mixture may be heated.

According to the production process of the present invention, the oil phase solution of the aluminum chelator and the polyfunctional isocyanate compound in the volatile organic solvent is added to an aqueous phase containing a disperser. The mixture is then heated and stirred to promote interfacial polymerization. The disperser may be polyvinyl alcohol, carboxymethylcellulose, gelatin or other dispersers that are commonly used in interfacial polymerization processes. The amount of the disperser is typically 0.1 to 10.0 mass % of the aqueous phase.

The amount of the oil phase solution relative to the aqueous phase is preferably in the range of 5 to 50 parts by weight with respect to 100 parts by weight of the aqueous phase. Too little oil phase solution results in the formation of polydispersed particles, whereas too much of it results in the formation of fine particles that tend to aggregate.

Emulsification during the interfacial polymerization is preferably carried out by stirring the reaction mixture under a particular condition suitable to form the organic phase 0.5 to 100 μm in size (i.e., 8000 rpm or faster rate on a homogenizer). The reaction mixture is typically stirred under atmospheric pressure at a temperature of 30 to 80° C. over a time period of 2 to 12 hours while being heated.

Once the interfacial polymerization is completed, the resulting polymer fine particles are collected by filtration and are then dried to obtain the latent curing agent of the present invention.

By using the above-described production process of the latent aluminum chelate curing agent, the curing performance of the curing agent can be controlled by varying the type and amount of the polyfunctional isocyanate compound, the type and amount of the aluminum chelator and the conditions for interfacial polymerization. For example, decreasing the polymerization temperature can decrease the curing temperature. Conversely, increasing the polymerization temperature can increase the curing temperature.

The latent aluminum chelate curing agent described above can be used in the same applications as the conventional imidazole-based latent curing agents. Preferably, the curing agent can be used in conjunction with the silane-coupling agent and the epoxy resin to make a low-temperature, fast-curing thermosetting epoxy resin composition.

The amount of the aluminum chelator, in particular, the amount of the latent aluminum chelate curing agent in the thermosetting epoxy resin composition is preferably in the range of 0.5 to 70 wt %, more preferably in the range of 1 to 20 wt % (by solid content) of the thermosetting epoxy resin composition. Too little of the aluminum chelator results in insufficient curing of the resin composition, whereas too much of it leads to a decrease in the resin properties of the cured product of the composition (e.g., flexibility).

As described in paragraphs 0007 through 0010 of Japanese Patent Application Laid-Open No. 2002-212537, the silane-coupling agent acts in concert with the aluminum chelator, in particular with the latent aluminum chelate curing agent, to initiate the cationic polymerization of the epoxy resin. The silane-coupling agent has 1 to 3 lower alkoxyl groups in its molecule and may have a functional group that reacts with the functional group of the thermosetting epoxy resin. Examples of such functional groups include vinyl group, styryl group, acryloyloxy group, methacryloyloxy group, epoxy group, amino group, and mercapto group. Since the aluminum chelator, in particular the latent aluminum chelate curing agent, is a cationic curing agent, the coupling agents having amino groups or mercapto groups can be used when these functional groups do not substantially capture the generated cationic species.

Specific examples of the silane-coupling agent include vinyl tris(γ-methoxyethoxy)silane, vinyltriethoxysilane, vinyltrimethoxysilane, γ-styryltrimethoxysilane, γ-metacryloxypropyltrimethoxysilane, γ-acryloxypropyltrimethoxysilane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane and γ-chloropropyltrimethoxysilane.

The amount of the silane-coupling agent in the thermosetting epoxy resin composition is typically in the range of 50 to 1500 parts by weight, preferably in the range of 300 to 1200 parts by weight with respect to 100 parts by weight of the aluminum chelator, in particular, the latent aluminum chelate curing agent. Too little of the silane-coupling agent decreases the curability of the resin composition, whereas too much of it results in a decrease in the resin properties of the cured product of the composition (e.g., storage stability).

Aside from the internal epoxy compounds and internal epoxy resins, such as cyclohexene oxide, terminal epoxy resins having terminal oxirane rings may be used as the thermosetting epoxy resin for use in the present invention.

The thermosetting epoxy resin may be provided in the form of liquid or solid. It typically has an epoxy equivalent of about 100 to about 4000 and preferably has 2 or more epoxy groups in its molecule. Preferred examples thereof include bisphenol A-type epoxy compounds, phenol novolac-type epoxy compounds, cresol novolac-type epoxy compounds, ester-type epoxy compounds and alicyclic epoxy compounds. These compounds may be monomers or oligomers.

When necessary, silica, mica and other fillers, pigments and antistats may be added to the thermosetting epoxy resin composition of the present invention. The thermosetting resin composition of the present invention preferably contains 1 to 10 mass % of conductive particles, metal particles or resin cores that are coated with a metal plate layer, with their size in the order of several microns, or these particles additionally covered with an insulative film. In this manner, the thermosetting resin composition of the present invention can be used as an anisotropic conductive adhesive paste or an anisotropic conductive film.

The thermosetting epoxy resin composition of the present invention can be produced by uniformly mixing together the aluminum chelate/silanol curing catalyst system (a catalyst system composed of the aluminum chelator (in particular, latent aluminum chelate curing agent) and the silane-coupling agent), the thermosetting epoxy resin, and optional additives. These components are mixed by using common mixing techniques.

In addition to the aluminum chelate/silanol curing catalyst system, the thermosetting epoxy resin composition of the present invention contains the anion-trapping agent. The anion-trapping agent serves to ensure that the cationic species attacks the oxygen atom in the oxirane ring and to prevent nucleophilic addition of the silanolate anion to the beta-carbon of the oxirane ring of terminal epoxy resins. Therefore, the present invention enables the use of terminal epoxy resins as the epoxy components of low-temperature, fast-curing thermosetting epoxy resin compositions containing aluminum chelate/silanol curing catalyst system. This is particularly advantageous when the aluminum chelator to make the aluminum chelate/silanol curing catalyst system is a latent aluminum chelate curing agent, since the storage stability of the thermosetting epoxy resin composition is increased even when it is provided as a single formulation. The latent aluminum chelate curing agent acts in concert with the silane-coupling agent to promote cationic polymerization of thermosetting epoxy resin compositions, thus facilitating the low-temperature, fast curing of the resin compositions.

EXAMPLES

The present invention will now be described with reference to examples.

Reference Example 1

800 parts by weight of distilled water, 0.05 parts by weight of a surfactant (NEWREX R-T, NOF Corp.) and 4 parts by weight of polyvinyl alcohol as a disperser (PVA-205, Kuraray Co., Ltd.) were placed in a 3-liter reaction vessel for interfacial polymerization equipped with a thermometer. The components were thoroughly mixed to make a uniform mixture. An oil phase solution was obtained by dissolving, in 30 parts by weight of ethyl acetate, 11 parts by weight of aluminum monoacetylacetonate bis(ethylacetoacetate) in 24% isopropanol (Aluminum chelate D, Kawaken Fine Chemicals Co., Ltd.) and 11 parts by weight of trimethylolpropane (1 mol) adduct of methylene diphenyl-4,4'-diisocyanate (3 mol) (D-109, Mitsui Takeda Pharmaceutical Co., Ltd.). This oil phase solution was added to the mixture in the reaction vessel and was emulsified by a homogenizer (11,000 rpm/10 min). Subsequently, the mixture was left overnight at 60° C. for interfacial polymerization.

Upon completion of the reaction, the polymerization mixture was allowed to cool to room temperature and the interfacial polymer particles formed during the interfacial polymerization were collected by filtration. The collected particles were then dried to give 20 parts by weight of a latent aluminum chelate curing agent as spherical particles about 10 μm in size.

Example 1

The following components were uniformly mixed together to make a thermosetting epoxy resin composition of Example 1: 100 parts by weight of an epoxy resin (alicyclic epoxy compound (CEL2021P, Daicel Chemical Industries, Ltd.): terminal epoxy resin (naphthalene-type epoxy resin, HP-4032D, Japan Epoxy Resin Co., Ltd.)=70:30 (by weight)), 13 parts by weight of an anion-trapping agent (Bisphenol S, BPS-24C, Nicca Chemical Co., Ltd.), 12 parts by weight of acryloyloxy-type silane-coupling agent (KBM5103, Shin-Etsu Chemical Co., Ltd.) and 2 parts by weight of the latent aluminum chelate curing agent obtained in Reference Example 1.

Comparative Example 1

The same procedure was repeated as in Example 1, except that the anion-trapping agent was not used. The product was designated as a thermosetting epoxy resin composition of Comparative Example 1.

Comparative Example 2

The same procedure was repeated as in Example 1, except that the aluminum chelate/silanol curing catalyst system composed of the acryloyloxy-type silane-coupling agent and the latent aluminum chelate curing agent was not used. The product was designated as a thermosetting epoxy resin composition of Comparative Example 2.

Figure 2:
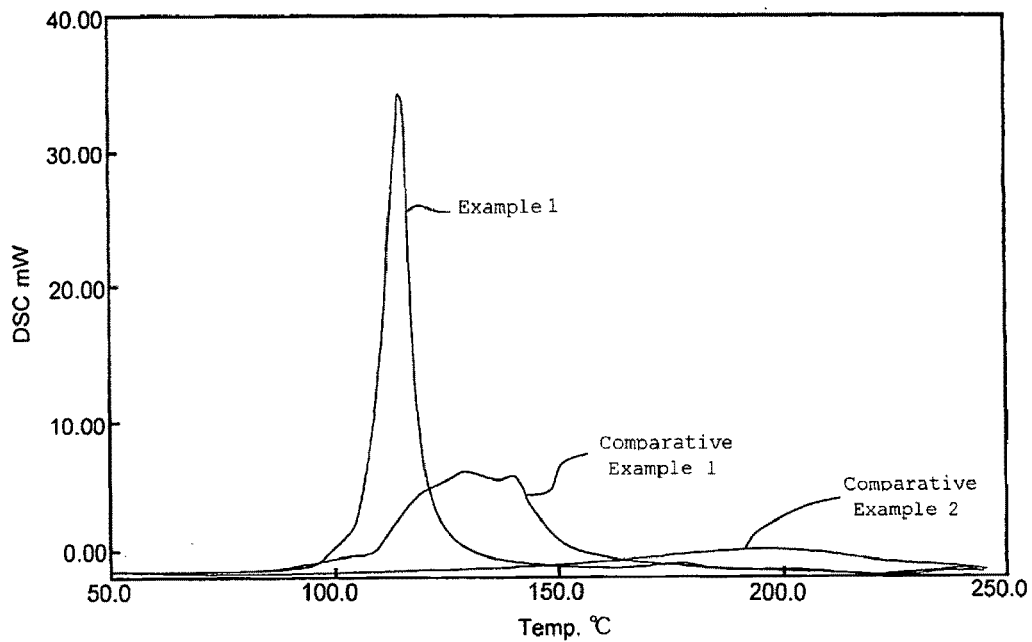
FIG. 2 is a diagram showing the results of DSC for thermosetting epoxy resin compositions of Example 1 and Comparative Examples 1 and 2.

Each of the thermosetting epoxy resin compositions obtained in Example 1 and Comparative Examples 1 and 2 was subjected to thermal analysis by a differential scanning calorimeter (DSC) (DSC6200, Seiko Instruments Co., Ltd.) by heating at a rate of 5° C./min. The results are shown in FIG. 2 (DSC diagram). The curing performance of the latent curing agent is determined by the following factors: The temperature at which the curing starts, given by the temperature at which exothermic process begins; the temperature at which the curing activity is the highest, given by the exothermic peak temperature; the temperature at which the curing comes to an end, given by the temperature at which exothermic process comes to an end; and the amount of generated heat, given by the area under the peak.

As shown in FIG. 2, the results of Comparative Example 2 indicate that the reactivity is very low when the anion-trapping agent is used in the absence of the aluminum chelate/silanol curing catalyst system. The results of Comparative Example 1 indicate that the reactivity with the terminal epoxy resin-mixed system is still insufficient when the aluminum chelate/silanol curing catalyst system is used in the absence of the anion-trapping agent. In contrast, the results of Example 1 demonstrate that the low-temperature, fast curing property is achieved even in the terminal epoxy resin when the aluminum chelate/silanol curing catalyst system is used in combination with the anion-trapping agent.

Examples 2 Through 4

The same procedure was repeated as in Example 1, except that the naphthalene-type epoxy resin (HP-4032D) used as the terminal epoxy resin was replaced with a bisphenol F-type epoxy resin (EP807, Japan Epoxy Resin Co., Ltd.), a bisphenol A-type epoxy resin (EP828EL, Japan Epoxy Resin Co., Ltd.) or a bisphenol A-type epoxy resin (EP825, Japan Epoxy Resin Co., Ltd.). The products were designated as thermosetting epoxy resin compositions of Examples 2 through 4, respectively.

As in Example 1, each of the thermosetting epoxy resin compositions of Examples 2 through 4 was subjected to differential thermal analysis. The results are shown in Table 1 and FIG. 3 along with the results of the thermal analysis of the thermosetting epoxy resin composition of Example 1.

TABLE 1

| Epoxy resin formulation | Exothermic peak temperature (° C.) | Exothermic peak intensity (mW) |
|---|---|---|
| Example 2 CEL2021P:EP807 = 70:30 | 114 | 37.96 |
| Example 1 CEL2021P:HP4032D = 70:30 | 115 | 34.36 |
| Example 3 CEL2021P:EP828EL = 70:30 | 118 | 38.50 |
| Example 4 CEL2021P:EP825 = 70:30 | 117 | 25.41 |

Figure 3:
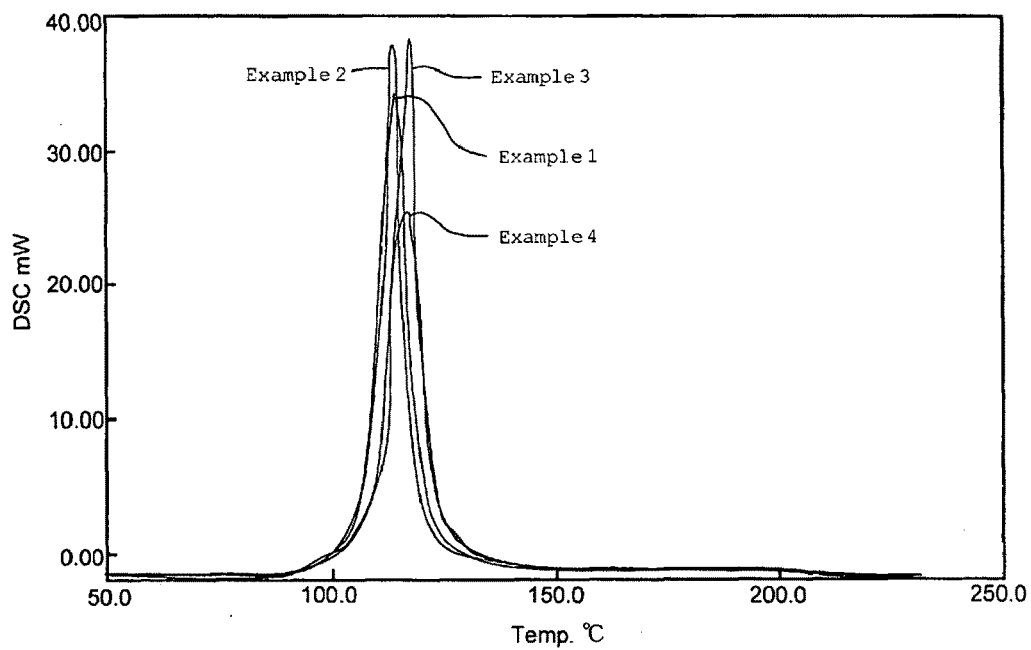
FIG. 3 is a diagram showing the results of DSC for thermosetting epoxy resins prepared in Examples 2 through 4.

As shown in Table 1 and FIG. 3, the exothermal peak intensity is 30 mW or higher for each terminal epoxy resin used, indicating that each resin composition is sufficiently cured. Of the two types of the bisphenol A-type epoxy resins, EP828EL with a greater epoxy equivalent (Example 3) allows the resin composition to cure faster than the other.

Examples 5 Through 8

The same procedure was repeated as in Example 1, except that the ratio (by weight) of the alicyclic epoxy compound to the terminal epoxy resin was adjusted to 60:40 (Example 5), 50:50 (Example 6), 40:60 (Example 7) or 30:70 (Example 8). The products were designated as thermosetting epoxy resin compositions of Examples 5 through 8, respectively.

As in Example 1, each of the thermosetting epoxy resin compositions of Examples 5 through 8 was subjected to differential thermal analysis. The results are shown in Table 2 and FIG. 4 along with the results of the thermal analysis of the thermosetting epoxy resin composition of Example 1.

TABLE 2

| Epoxy resin formulation | Exothermic peak temperature (° C.) | Exothermic peak intensity (mW) |
|---|---|---|
| Example 1 CEL2021P:HP4032D = 70:30 | 115 | 34.36 |
| Example 5 CEL2021P:HP4032D = 60:40 | 113 | 34.28 |
| Example 6 CEL2021P:HP4032D = 50:50 | 113 | 29.87 |
| Example 7 CEL2021P:HP4032D = 40:60 | 115 | 30.45 |
| Example 8 CEL2021P:HP4032D = 30:70 | 121 | 13.58 |

Figure 4:
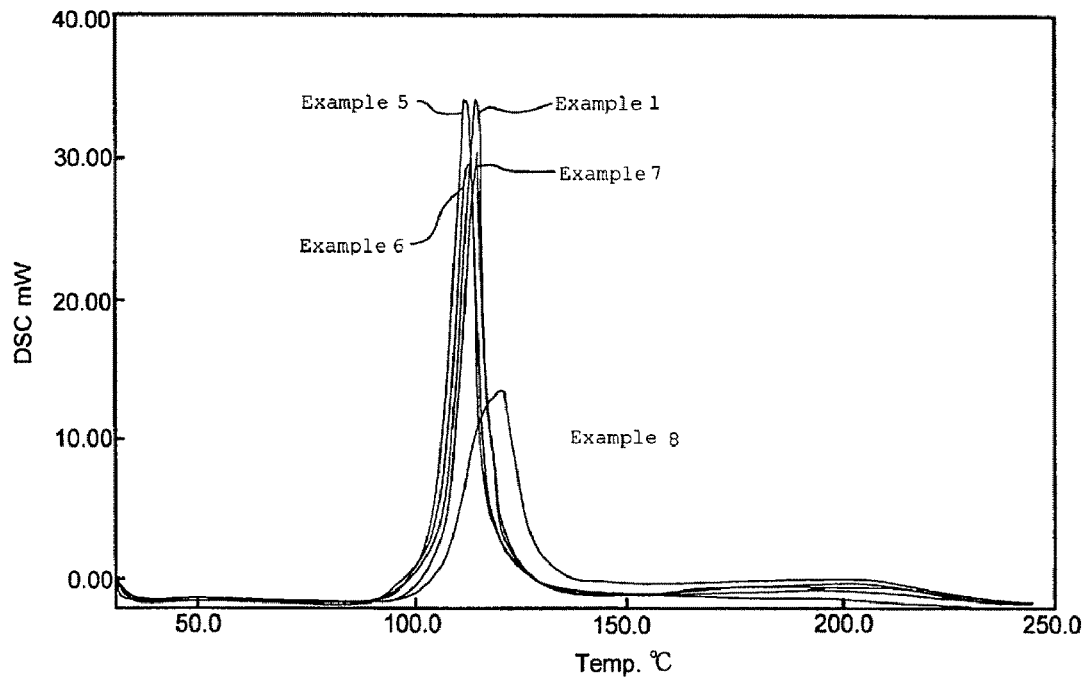
FIG. 4 is a diagram showing the results of DSC for thermosetting epoxy resins prepared in Examples 5 through 8.

As shown in Table 2 and FIG. 4, exothermic peak intensity of 30 mW or higher (indicative of low-temperature, fast curing property) is achieved at 115° C. even when the amount of the naphthalene-type terminal epoxy resin is 60%.

Examples 9 Through 11

The same procedure was repeated as in Example 2, except that the ratio (by weight) of the alicyclic epoxy compound to the terminal epoxy resin was adjusted to 60:40 (Example 9), 50:50 (Example 10) or 40:60 (Example 11). The products were designated as thermosetting epoxy resin compositions of Examples 9 through 11, respectively.

As in Example 1, each of the thermosetting epoxy resin compositions of Examples 9 through 11 was subjected to differential thermal analysis. The results are shown in Table 3 and FIG. 5 along with the results of the thermal analysis of the thermosetting epoxy resin composition of Example 2.

TABLE 3

| Epoxy resin formulation | Exothermic peak temperature (° C.) | Exothermic peak intensity (mW) |
|---|---|---|
| Example 2 CEL2021P:EP807 = 70:30 | 114 | 37.96 |
| Example 9 CEL2021P:EP807 = 60:40 | 117 | 33.21 |
| Example 10 CEL2021P:EP807 = 50:50 | 117 | 19.84 |
| Example 11 CEL2021P:EP807 = 40:60 | 129 | 11.78 |

Figure 5:
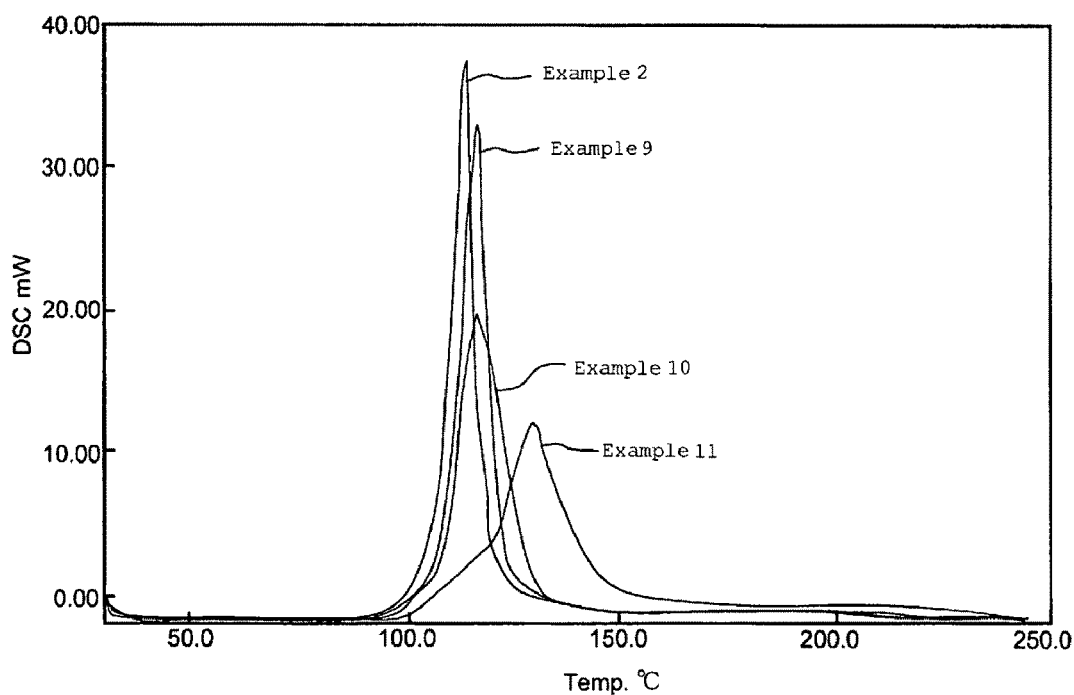
FIG. 5 is a diagram showing the results of DSC for thermosetting epoxy resin compositions prepared in Examples 9 through 11.

As shown in Table 3 and FIG. 5, exothermic peak intensity of 30 mW or higher (indicative of low-temperature, fast curing property) is achieved at 117° C. even when the amount of the bisphenol F-type terminal epoxy resin is 40%.

The results of Examples 1 through 11 reveal that, unlike the aluminum chelate/silanol curing catalyst system used alone, the aluminum chelate/silanol curing catalyst system used in combination with the bisphenol-type anion-trapping agent can promote fast curing of terminal epoxy resins at low temperatures. Approximately 10% of the anion-trapping agent present with respect to the 100 parts by weight of the epoxy resin has proven effective.

Examples 12a Through 12c

The following components were uniformly mixed together: 100 parts by weight of an epoxy resin (alicyclic epoxy compound (CEL2021P, Daicel Chemical Industries, Ltd.): terminal epoxy resin (naphthalene-type epoxy resin, HP-4032D, Japan Epoxy Resin Co., Ltd.)=70:30 (by weight)), 13 parts by weight of an anion-trapping agent (Bisphenol S, Nicca Chemical Co., Ltd.; Bisphenol A, Mitsui Chemicals Inc.; Bisphenol F-M (9% multinuclei form, Mitsui Chemicals Inc.; 4,4'-dihydroxyphenyl ether, Tokyo Chemical Industry Co., Ltd.)), 12 parts by weight of acryloyloxy-type silane-coupling agent (KBM5103, Shin-Etsu Chemical Co., Ltd.) and 2 parts by weight of the latent aluminum chelate curing agent obtained in Reference Example 1, thereby giving thermosetting epoxy resin compositions.

As in Example 1, each of the thermosetting epoxy resin compositions of Examples 12a through 12c was subjected to differential thermal analysis. The results are shown in Table 4 and FIG. 6 along with the results of the thermal analysis of the thermosetting epoxy resin composition of Example 1.

TABLE 4

| Anion-trapping agent | Exothermic peak temperature (° C.) | Exothermic peak intensity (mW) |
|---|---|---|
| Example 1 Bisphenol S | 115 | 34.36 |
| Example 12a Bisphenol A | 112 | 22.39 |
| Example 12b Bisphenol F-M | 110 | 24.59 |
| Example 12c Bisphenol ether | 109 | 17.38 |

Figure 6:
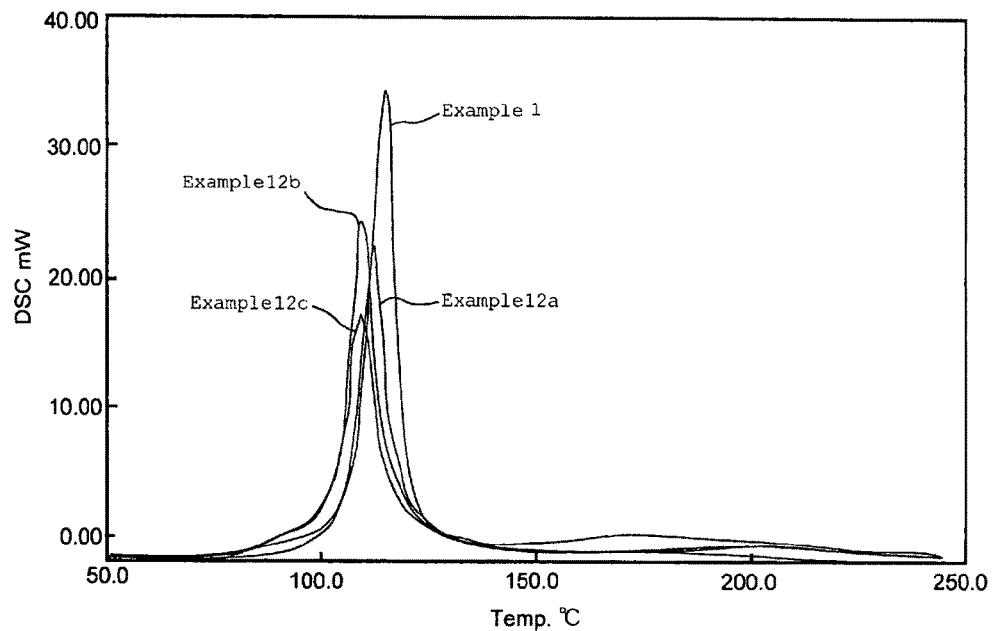
FIG. 6 is a diagram showing the results of DSC for thermosetting epoxy resin compositions prepared in Examples 12a through 12c.

As shown in Table 4 and FIG. 6, bisphenol S gives the best results of all the anion-trapping agents tested when the terminal epoxy resin is the naphthalene-type epoxy resin.

Examples 13a Through 13c

The same procedure was repeated as in Examples 12a through 12c, except that the naphthalene-type epoxy resin (HP-4032D) used as the terminal epoxy resin was replaced with a bisphenol F-type epoxy resin (EP807, Japan Epoxy Resin Co., Ltd.). The products were designated as thermosetting epoxy resin compositions of Examples 13a through 13c, respectively.

As in Example 1, each of the thermosetting epoxy resin compositions of Examples 13a through 13c was subjected to differential thermal analysis. The results are shown in Table 5 and FIG. 7 along with the results of the thermal analysis of the thermosetting epoxy resin composition of Example 2.

TABLE 5

| Anion-trapping agent | Exothermic peak temperature (° C.) | Exothermic peak intensity (mW) |
|---|---|---|
| Example 2 Bisphenol S | 114 | 37.94 |
| Example 13a Bisphenol A | 113 | 9.37 |
| Example 13b Bisphenol F-M | 112 | 24.01 |
| Example 13c Bisphenol E | 112 | 10.36 |

Figure 7:
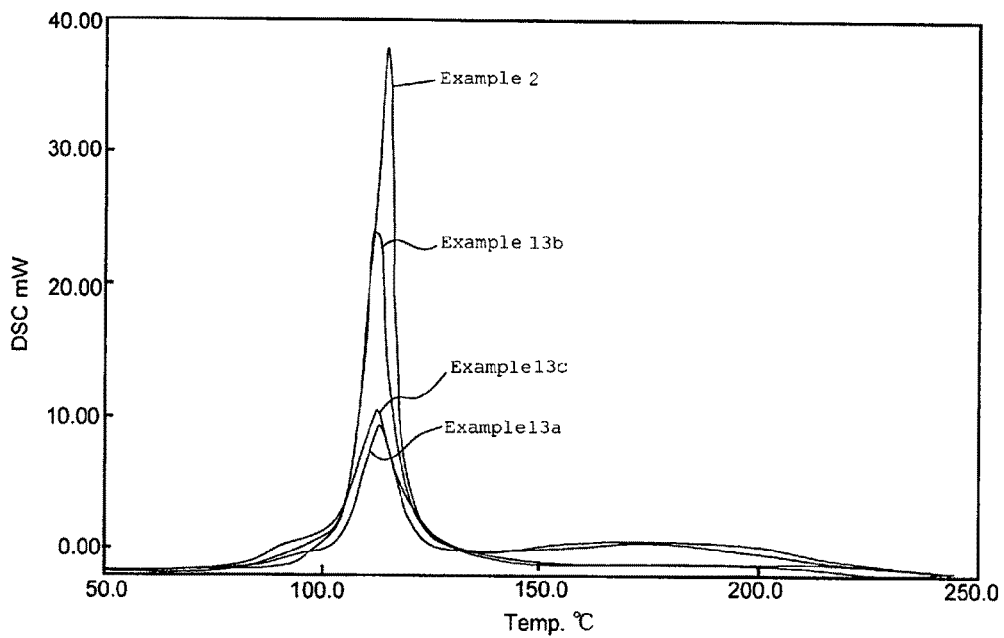
FIG. 7 is a diagram showing the results of DSC for thermosetting epoxy resin compositions prepared in Examples 13a through 13c.

As shown in Table 5 and FIG. 7, bisphenol S gives the best results of all the anion-trapping agents tested when the terminal epoxy resin is the bisphenol F-type epoxy resin.

Examples 14a Through 14e

The following components were uniformly mixed together: 100 parts by weight of an epoxy resin (alicyclic epoxy compound (CEL2021P, Daicel Chemical Industries, Ltd.): terminal epoxy resin (Bisphenol F-type epoxy resin, EP807, Japan Epoxy Resin Co., Ltd.)=50:50 (by weight)), 13 parts by weight of an anion-trapping agent (Bisphenol S, Nicca Chemical Co., Ltd.), 12 parts by weight of acryloyloxy-type silane-coupling agent (KBM5103, Shin-Etsu Chemical Co., Ltd.) and 2 parts by weight of the latent aluminum chelate curing agent obtained in Reference Example 1. The product was designated as a thermosetting epoxy resin composition of Example 14.

The thermosetting epoxy resin composition was pre-heated for 3 hours at 50° C., 60° C., 70° C. or 80° C. and was subjected to thermal analysis as in Example 1. The results are shown in Table 6 and FIG. 8.

TABLE 6

| | Heating temperature (° C.) | Exothermic peak temperature (° C.) | Exothermic peak intensity (mW) |
|---|---|---|---|
| Example 14a | Not heated | 116 | 21.74 |
| Example 14b | 50 | 116 | 23.81 |
| Example 14c | 60 | 119 | 28.04 |
| Example 14d | 70 | 121 | 28.02 |
| Example 14e | 80 | 129 | 17.19 |

Figure 8:
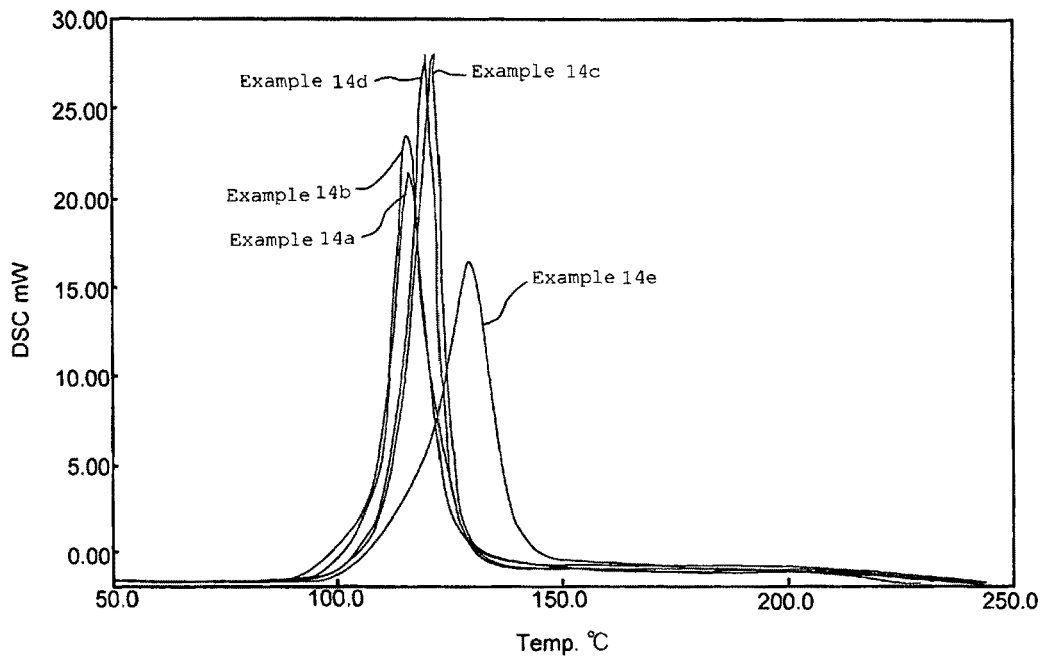
FIG. 8 is a diagram showing the results of DSC for thermosetting epoxy resin compositions prepared in Examples 14a through 14e.

As shown in Table 6 and FIG. 8, the exothermic peak intensity tends to increase as a result of pre-heating. The best results are obtained when the resin composition was pre-heated at 60 to 70° C. Though the exact mechanism is unknown, it is believed that the pre-heat treatment caused the bisphenol derivative to add to the beta-carbon of the oxirane ring of the terminal epoxy resin.

Examples 15a Through 15d

The same procedure was repeated as in Examples 14a, and 14c through 14e, except that the bisphenol S (BPS-24C, 95% purity) used as the anion-trapping agent was replaced with bisphenol S (24BS, 99% or higher purity) manufactured by Konishi Chemical Industry Co., Ltd. The products were designated as thermosetting epoxy resin compositions of Examples 15a through 15d.

The thermosetting epoxy resin compositions were subjected to thermal analysis as in Examples 14a, and 14c through 14e. The results are shown in Table 7 and FIG. 9.

TABLE 7

| | Heating temperature (° C.) | Exothermic peak temperature (° C.) | Exothermic peak intensity (mW) |
|---|---|---|---|
| Example 15a | Not heated | 121 | 22.60 |
| Example 15b | 60 | 125 | 23.94 |
| Example 15c | 70 | 122 | 34.09 |
| Example 15d | 80 | 122 | 32.93 |

Figure 9:
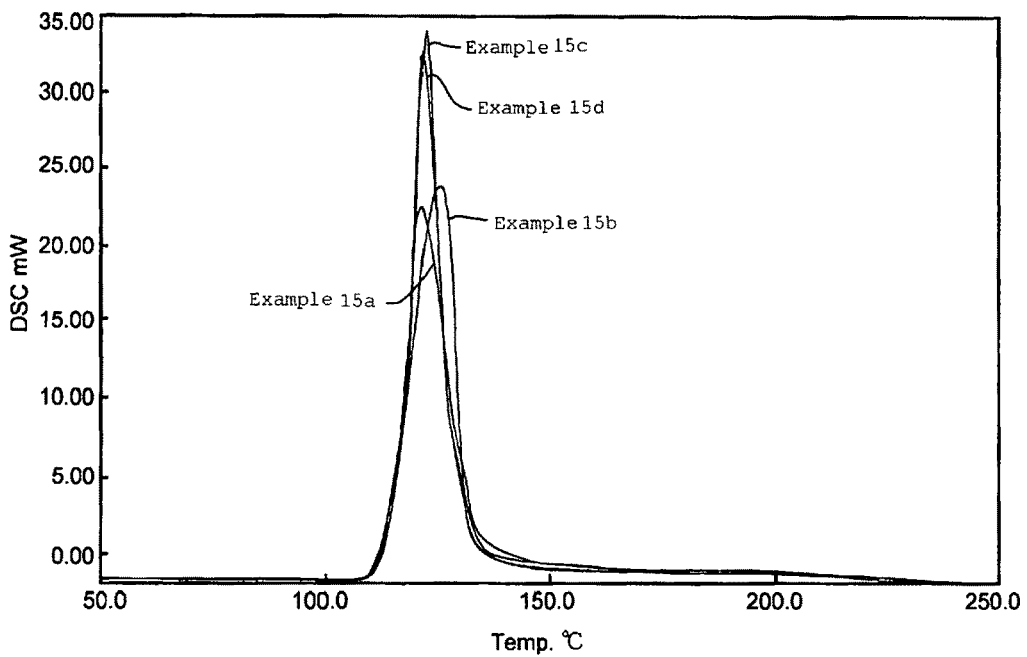
FIG. 9 is a diagram showing the results of DSC for thermosetting epoxy resin compositions prepared in Examples 15a through 15d.

As shown in Table 7 and FIG. 9, the favorable temperature range for pre-heating rises from 60 to 70° C. (Table 6) to 70 to 80° C. and the exothermic peak intensity increases when the high purity anion-trapping agent is used.

Examples 16a Through 16d and Control 16

The following components were uniformly mixed together: 90 parts by weight of an epoxy resin (alicyclic epoxy compound (CEL2021P, Daicel Chemical Industries, Ltd.), 12 parts by weight of an acryloyloxy-type silane-coupling agent (KBM5103, Shin-Etsu Chemical Co., Ltd.), 2 parts by weight of an aluminum chelator (Alumichelate D, Kawaken Fine Chemicals Co., Ltd.) and 1 part by weight of an acid anhydride (given in Table 8) as the anion-trapping agent. The products were designated as thermosetting epoxy resin compositions of Examples 16a through 16d. The same composition was also prepared but without acid anhydride and was designated as Control 16.

As in Example 1, each of the thermosetting epoxy resin compositions was subjected to thermal analysis. The results are shown in Table 8 and FIG. 11.

TABLE 8

|  | Acid anhydride | Exothermic peak temperature (° C.) | Exothermic peak intensity (mW) |
| --- | --- | --- | --- |
| Control 16 | None | 45.6 | 7.76 |
| Example 16a | Maleic anhydride | 46.7 | 9.60 |
| Example 16b | Acetic anhydride | 47.1 | 10.74 |
| Example 16c | Propionic anhydride | 49.1 | 10.24 |
| Example 16d | Phthalic anhydride | 62.5 | 11.60 |

Figure 11:
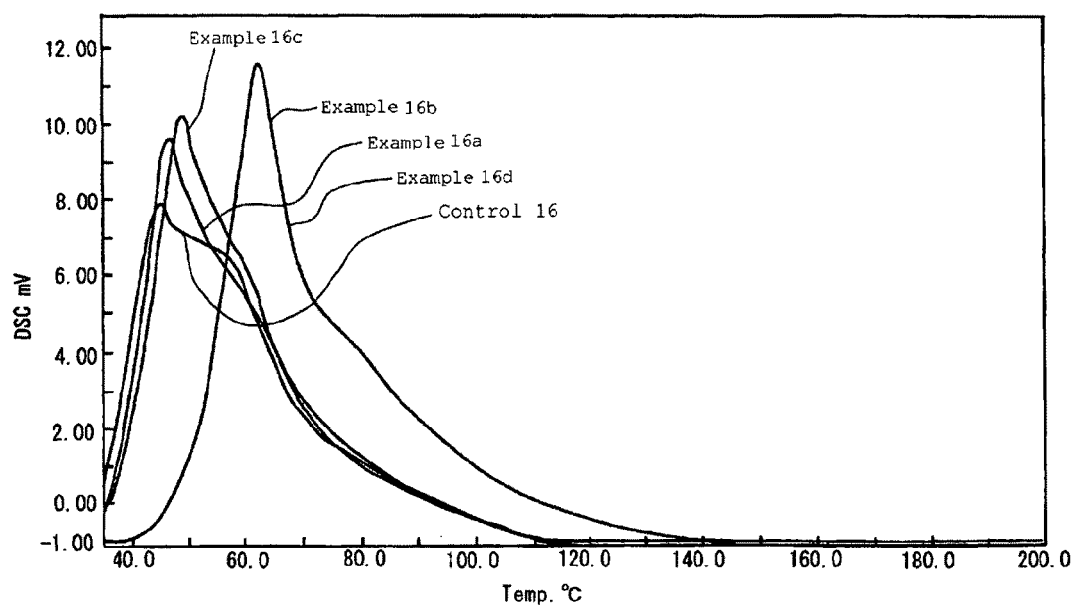
FIG. 11 is a diagram showing the results of DSC for thermosetting epoxy resin compositions prepared in Examples 16a through 16d and Control 16.

As shown in Table 8 and FIG. 11, the exothermic peak intensity during the curing process is increased (i.e., fast curability is increased) for each of the resin compositions of Examples 16a through 16d containing an acid hydride. A shift in the curing temperature toward higher temperatures is observed for the resin composition of Example 16d containing phthalic anhydride. This is believed to be because the carbonyl carbon of the acid anhydride is susceptible to attacks by anions. The hydrolysis half-lives of acid anhydrides at 25° C. were 0.37 min for maleic anhydride and 1.5 min for phthalic anhydride.

Examples 17a Through 17c

The following components were uniformly mixed together: 90 parts by weight of an epoxy resin (alicyclic epoxy compound (CEL2021P, Daicel Chemical Industries, Ltd.), 12 parts by weight of acryloyloxy-type silane-coupling agent (KBM5103, Shin-Etsu Chemical Co., Ltd.), 2 parts by weight of an aluminum chelator (Alumichelate D, Kawaken Fine Chemicals Co., Ltd.) and a predetermined amount of maleic anhydride as the anion-trapping agent (Table 9). The products were designated as thermosetting epoxy resin compositions of Examples 17a through 17c.

As in Example 1, each of the thermosetting epoxy resin compositions was subjected to thermal analysis. The results are shown in Table 9 and FIG. 12.

TABLE 9

|  | Maleic anhydride (parts by weight) | Exothermic peak temperature (° C.) | Exothermic peak intensity (mW) |
| --- | --- | --- | --- |
| Example 17a | 1 | 46.8 | 9.61 |
| Example 17b | 2 | 47.6 | 9.78 |
| Example 17c | 4 | 52.7 | 9.59 |

Figure 12:
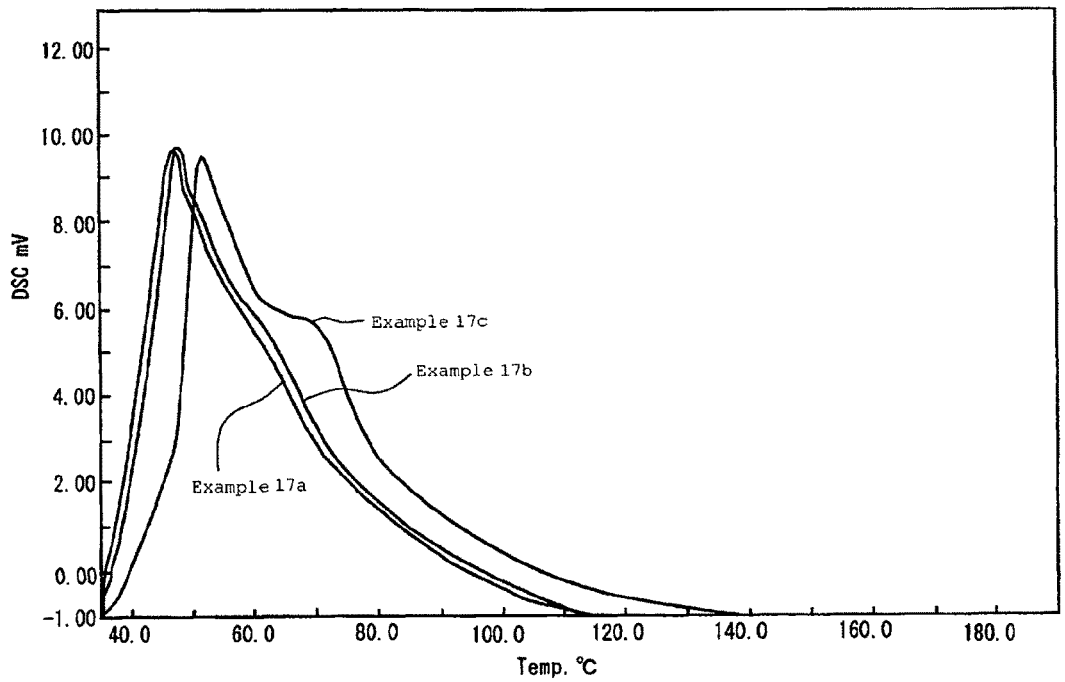
FIG. 12 is a diagram showing the results of DSC for thermosetting epoxy resin compositions prepared in Examples 17a through 17c.

As shown in Table 9 and FIG. 12, the resin compositions cure at increasing temperatures as the amount of maleic anhydride is increased from an equal amount (Example 17a), to twice (Example 17b), and to four times (Example 17c) the amount of the aluminum chelator (catalytic amount). This is believed to be because excess acid anhydride leads to an increased tendency of Bronsted acid, the cationic catalyst, to be captured, resulting in a decreased reaction rate. These results show that maleic anhydride is preferably added in an amount less than or equal to the aluminum chelator (catalytic amount).

Examples 18a and 18b, and Control 18

The following components were uniformly mixed together: 90 parts by weight of an epoxy resin (alicyclic epoxy compound (CEL2021P, Daicel Chemical Industries, Ltd.), 12 parts by weight of an acryloyloxy-type silane-coupling agent (KBM5103, Shin-Etsu Chemical Co., Ltd.), 2 parts by weight of a latent aluminum chelate curing agent (latent aluminum chelate curing agent described in Example 1 in paragraphs 0053 and 0054 of Japanese Patent Application Laid-Open No. 2006-070051) and a predetermined amount of maleic anhydride (given in Table 10) as the anion-trapping agent. The products were designated as thermosetting epoxy resin compositions of Examples 18a and 18b and Control 18.

As in Example 1, each of the thermosetting epoxy resin compositions was subjected to thermal analysis. The results are shown in Table 10 and FIG. 13.

TABLE 10

|  | Maleic anhydride (parts by weight) | Exothermic peak temperature (° C.) | Exothermic peak intensity (mW) |
| --- | --- | --- | --- |
| Control 18 | None | 109.4 | 30.33 |
| Example 18a | 2 | 102.0 | 19.46 |
| Example 18b | 4 | 99.5 | 10.04 |

Figure 13:
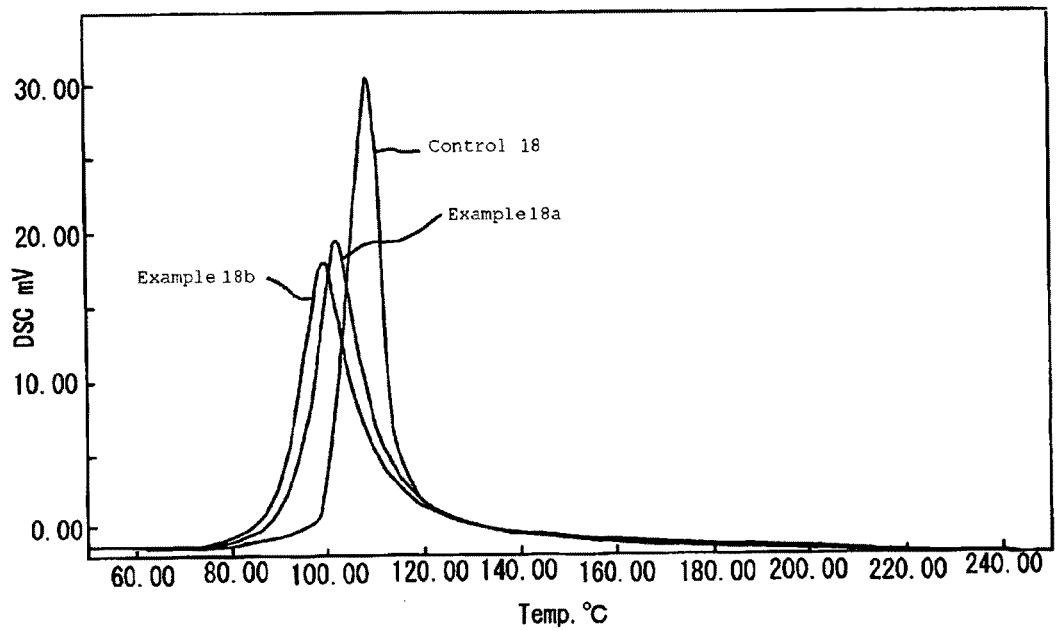
FIG. 13 is a diagram showing the results of DSC for thermosetting epoxy resin compositions prepared in Examples 18a and 18b and Control 18.

As shown in Table 10 and FIG. 13, the presence of maleic anhydride results in a decrease in the exothermic peak temperature of the latent aluminum chelate curing agent. The exothermic peak temperature is decreased by as much as about 10° C. for the resin composition of Example 18b containing 4 parts by weight of maleic anhydride. The reason for this is believed to be that the presence of acid anhydride leads to increased amounts of Bronsted acid ($H^+$) generated initially. As a result, the silanolate anion, the reactive species that terminates polymerization, is captured, thus causing an increased acid dissociation.

Example 19 and Control 19

The following components were uniformly mixed together: 90 parts by weight of an epoxy resin (alicyclic epoxy compound (CEL2021P, Daicel Chemical Industries, Ltd.): terminal epoxy resin (Bisphenol F-type epoxy resin, EP807, Japan Epoxy Resin Co., Ltd.)=50:50 (by weight)), 12 parts by weight of an acryloyloxy-type silane-coupling agent (KBM5103, Shin-Etsu Chemical Co., Ltd.), 2 parts by weight of an aluminum chelator (Alumichelate D, Kawaken Fine Chemicals Co., Ltd.) and 1 part by weight of acetic anhydride as the anion-trapping agent. The product was designated as a thermosetting epoxy resin composition of Example 19. The same composition was prepared but without maleic anhydride and was designated as Control 19.

Figure 14:
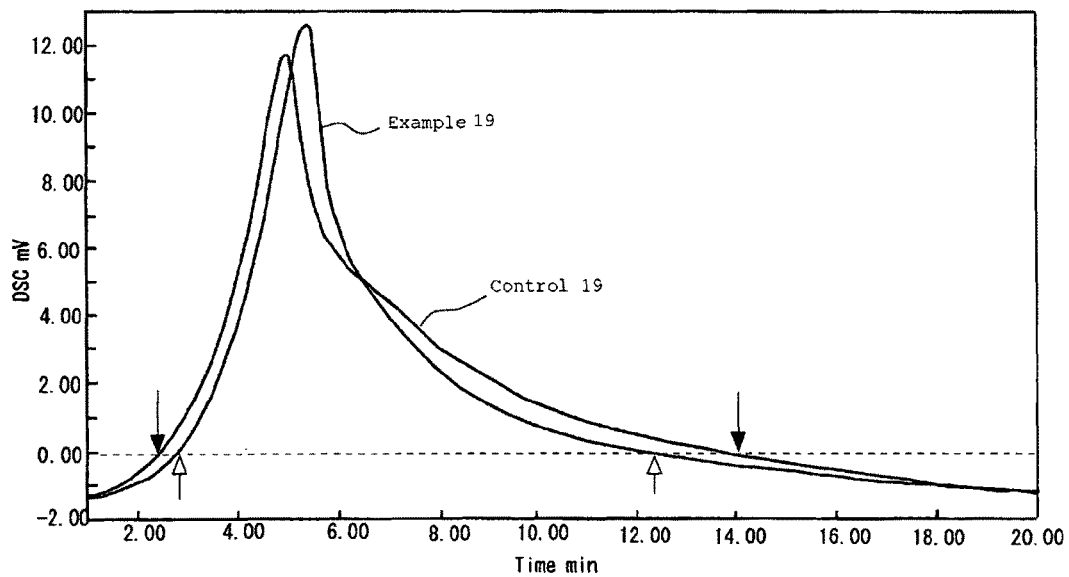
FIG. 14 is a diagram showing the results of DSC for thermosetting epoxy resin compositions prepared in Example 19 and Control 19.

As in Example 1, each of the thermosetting epoxy resin compositions was subjected to thermal analysis. The results are shown in Table 11 and FIG. 14.

TABLE 11

|  | Acetic anhydride (parts by weight) | Time at which curing started (min) | Time at which curing ended (min) | Curing time (min) |
|---|---|---|---|---|
| Control 19 | None | 2.44 | 14.01 | 11.57 |
| Example 19 | 1 | 2.73 | 12.46 | 9.73 |

Note:
Time at which curing started:Time at which exothermic process started = DSC 0 mW
Time at which curing ended:Time at which exothermic process ended = DSC 0 mW
Curing time = Time at which curing ended – Time at which curing started A cationic catalyst, the aluminum chelate/silanol catalyst is generally considered unsuitable for curing epoxy resins other than alicyclic epoxy resins of cyclohexane oxide-type. However, the presence of acetic anhydride serves to increase the exothermic peak intensity and decrease the curing time even for the universal epoxy resin system containing bisphenol F-type epoxy resin, as shown in Table 11 and FIG. 14. As a result, the curing of the resin composition is promoted.

Examples 20a Through 20e

The following components were uniformly mixed together: 90 parts by weight of an epoxy resin (alicyclic epoxy compound (CEL2021P, Daicel Chemical Industries, Ltd.): terminal epoxy resin (Bisphenol F-type epoxy resin, EP807, Japan Epoxy Resin Co., Ltd.)=50:50 (by weight)), 12 parts by weight of acryloyloxy-type silane-coupling agent (KBM5103, Shin-Etsu Chemical Co., Ltd.), 2 parts by weight of an aluminum chelator (Alumichelate D, Kawaken Fine Chemicals Co., Ltd.) and acetic anhydride as the anion-trapping agent (in amounts shown in Table 12). The products were designated as thermosetting epoxy resin compositions of Examples 20a through 20e.

As in Example 1, each of the thermosetting epoxy resin compositions was subjected to thermal analysis. The results are shown in Table 12 and FIG. 15.

TABLE 12

|  | Acetic anhydride (parts by weight) | Exothermic peak temperature (° C.) | Exothermic peak intensity (mW) | Exothermic peak area (mJ/mg) |
|---|---|---|---|---|
| Example 20a | 1 | 55.3 | 12.65 | −312 |
| Example 20b | 2 | 55.5 | 12.41 | −311 |
| Example 20c | 4 | 58.6 | 10.77 | −316 |
| Example 20d | 8 | 57.8 | 10.79 | −313 |
| Example 20e | 16 | 57.8 | 8.57 | −309 |

Figure 15:
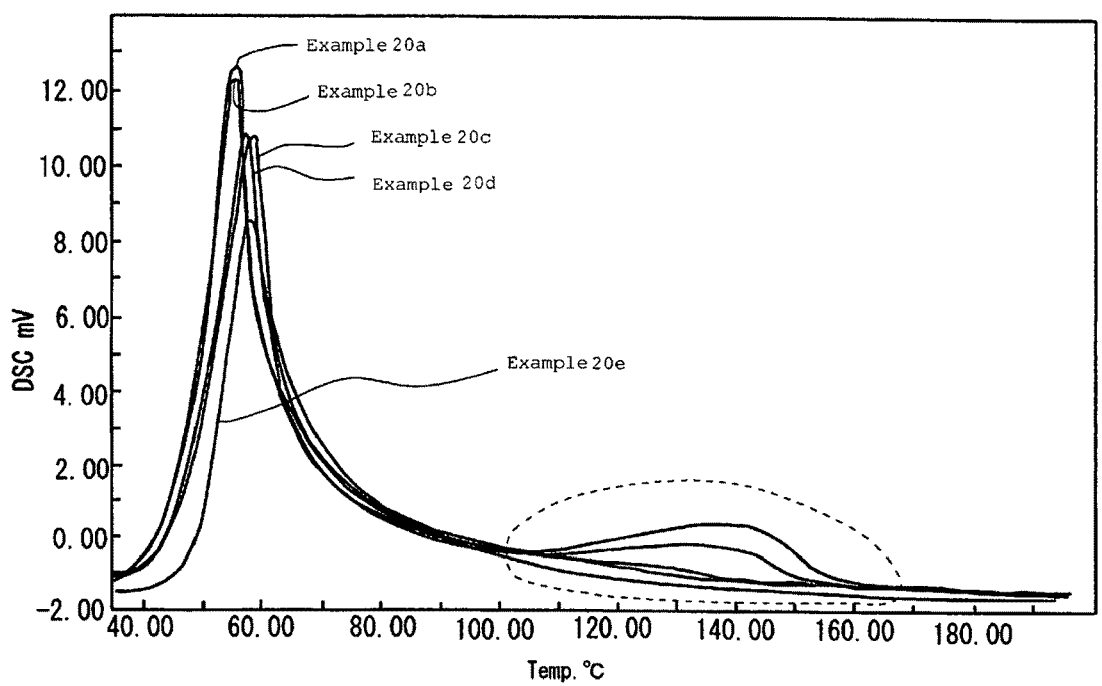
FIG. 15 is a diagram showing the results of DSC for thermosetting epoxy resin compositions prepared in Examples 20a through 20e.

As shown in Table 12 and FIG. 15, a second exothermic peak appears in a high temperature region of 100° C. or above for the universal epoxy resins (encircled by a single-dotted line in FIG. 15). The peak becomes more significant as the amount of acetic anhydride is increased (particularly significant when 4 parts by weight or more of acetic anhydride are added). Since the area of each exothermic peak is about −310 mJ/mg, the total heat generation is approximately the same for each resin composition. Nonetheless, two-step curing is observed as the amount of acid anhydride is increased. This indicates a reduction in the efficiency of the catalyst.

The exothermic peak appears in the high temperature region because the greater amount of acid anhydride results in more Bronsted acid captured. As a result, the cationic curability is decreased. This is believed to be because the anionic curability caused by acid anhydride becomes prominent. In general, curing by acid anhydrides is known to take place in a medium temperature range (100 to 150° C.).

These results demonstrate that the amount of acid anhydride required to promote the cationic polymerization of universal epoxy resins by the aluminum chelate/silanol catalyst is preferably less than or equal to the aluminum chelator to serve as the catalyst.

INDUSTRIAL APPLICABILITY

Containing an anion-trapping agent along with an aluminum chelate/silanol curing catalyst system, the thermosetting epoxy resin composition of the present invention may contain a terminal epoxy resin as its epoxy component and can still cure rapidly at low temperatures without termination of polymerization. Thus, the thermosetting epoxy resin composition is suitable for use as an anisotropic conductive adhesive that can establish anisotropic conductive bonding at low temperatures and in a short period of time.

The invention claimed is:

1. A thermosetting epoxy resin composition comprising an ionic curing catalyst system, an epoxy resin, and an anion-trapping agent;
   wherein the ionic curing catalyst system is a combination of an aluminum chelator and a silane coupling agent having 1 to 3 alkoxy groups per molecule; wherein the aluminum chelator and the silane coupling agent act in concert to initiate curing by cationic polymerization of the epoxy resin by generating hydrogen ions and silanolate anions; wherein the aluminum chelator and the silane coupling agent are provided in amounts effective to ensure both sufficient curing of the epoxy resin composition by cationic polymerization and sufficient properties of the cured resin composition;
   wherein the anion-trapping agent is capable of trapping silanolate anions; and wherein the anion trapping agent is provided in an amount effective to ensure both sufficient curing of the epoxy resin composition by cationic polymerization and sufficient storage stability of the resin composition.

2. The thermosetting epoxy resin composition according to claim 1, wherein the anion-trapping agent is an aromatic phenol derivative.

3. The thermosetting epoxy resin composition according to claim 2, wherein the aromatic phenol derivative is bisphenol S, bisphenol A, bisphenol F, or 4,4'-dihydroxyphenol ether.

4. The thermosetting epoxy resin composition according to claim 1, wherein an amount of the anion-trapping agent in the thermosetting epoxy resin composition is from 0.5 to 20 wt % by solid content.

5. The thermosetting epoxy resin composition according to claim 1, wherein the anion-trapping agent is an acid anhydride.

6. The thermosetting epoxy resin composition according to claim 5, wherein the acid anhydride is acetic anhydride, propionic anhydride, maleic anhydride, or phthalic anhydride.

7. The thermosetting epoxy resin composition according to claim 5, wherein the amount of the anion-trapping agent in the thermosetting epoxy resin composition is less than or equal to the amount of the ionic curing catalyst system, as determined by the combined amounts of aluminum chelator and silane coupling agent.

8. The thermosetting epoxy resin composition according to claim 1, wherein the aluminum chelator is provided in the range of 0.5 to 70 wt % (by solids) of the thermosetting epoxy resin composition, and the silane coupling agent is provided in the range of 50 to 1500 parts by weight with respect to the 100 parts by weight of the aluminum chelator.

9. The thermosetting epoxy resin composition according to claim 1, wherein the aluminum chelator is a latent aluminum chelate curing agent carried by a porous resin obtained through interfacial polymerization of a polyfunctional isocyanate compound.

10. The thermosetting epoxy resin composition according to claim 1, wherein the epoxy resin contains an epoxy resin having at least one terminal oxirane ring.

* * * * *